United States Patent
Kamijo et al.

(10) Patent No.: US 8,525,387 B2
(45) Date of Patent: Sep. 3, 2013

(54) PIEZOELECTRIC ACTUATOR, MOTOR, ROBOT HAND, AND ROBOT

(75) Inventors: Koichi Kamijo, Matsumoto (JP); Osamu Miyazawa, Suwa (JP); Akihiro Sawada, Matsumoto (JP); Reiko Nagahama, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/431,047

(22) Filed: Mar. 27, 2012

(65) Prior Publication Data

US 2012/0248805 A1 Oct. 4, 2012

(30) Foreign Application Priority Data

Mar. 29, 2011 (JP) ................... 2011-073559

(51) Int. Cl.
*H01L 41/08* (2006.01)

(52) U.S. Cl.
USPC .................................... 310/323.02

(58) Field of Classification Search
USPC ........................... 310/323.02, 328
See application file for complete search history.

(56) References Cited

U.S. PATENT DOCUMENTS

| 5,594,291 | A | 1/1997 | Tamai et al. |
| 7,378,777 | B2 * | 5/2008 | Moteki et al. ............ 310/323.16 |
| 2004/0027032 | A1 * | 2/2004 | Moteki et al. ............ 310/323.02 |
| 2006/0226737 | A1 * | 10/2006 | Miyazawa et al. ........ 310/323.02 |
| 2007/0188050 | A1 * | 8/2007 | Hashimoto ............ 310/323.02 |
| 2009/0278421 | A1 * | 11/2009 | Hamamoto et al. ...... 310/323.02 |

FOREIGN PATENT DOCUMENTS

| JP | 59-188381 | 10/1984 |
| JP | 06-038555 | 2/1994 |
| JP | 2001-286167 | 10/2001 |
| JP | 2003-159566 | 6/2003 |
| JP | 2004-159403 | 6/2004 |
| JP | 2005-073341 | 3/2005 |
| JP | 2005-086991 | 3/2005 |
| JP | 2010-233335 | 10/2010 |

* cited by examiner

*Primary Examiner* — Mark Budd
(74) *Attorney, Agent, or Firm* — Harness, Dickey & Pierce, P.L.C.

(57) ABSTRACT

A motor includes a vibrating plate having a projection part to be pressed against a driven member and a piezoelectric material provided on the vibrating plate, wherein a Young's modulus $E_L$ in the pressing direction of the vibrating plate and a Young's modulus $E_S$ in a direction crossing the pressing direction are different.

19 Claims, 10 Drawing Sheets

| | LONGITUDINAL RESONANCE FREQUENCY (f1) | FLEXURAL RESONANCE FREQUENCY (f2) | $\Delta f$ | LONGITUDINAL RESONANCE IMPEDANCE ($Z_{f1}$) | FLEXURAL RESONANCE IMPEDANCE ($Z_{f2}$) |
|---|---|---|---|---|---|
| ACTUATOR SAMPLE A | 276.5 | 280.5 | 4.0 | 5.0 | 25.0 |
| ACTUATOR SAMPLE B | 270.0 | 275.0 | 5.0 | 5.0 | 60.0 |

PIEZOELECTRIC ACTUATOR, MOTOR, ROBOT HAND, AND ROBOT

BACKGROUND

1. Technical Field

The present invention relates to a piezoelectric actuator, a motor, a robot hand, and a robot.

2. Related Art

As a motor for driving a driven member by vibration of a piezoelectric device, a motor that drives a driven member using an actuator formed by stacking a piezoelectric device having a rectangular flat plate shape on a reinforcing plate having an integrally formed projection by bringing the projection of the reinforcing plate into contact with the driven member has been known (Patent Document 1 (JP-A-2001-286167)). In the motor including the piezoelectric actuator, the projection of the reinforcing plate of the piezoelectric actuator is urged against the driven member by urging means and flexural vibration of the piezoelectric device rotates the driven member in a predetermined direction via the reinforcing plate.

However, even in the above described Patent Document 1, the flexural vibration of the piezoelectric device itself is small and, in order to obtain a larger driving force or amount of rotation (rotation speed), a large piezoelectric actuator with the larger piezoelectric device has been problematic.

SUMMARY

An advantage of some aspects of the invention is to provide a piezoelectric actuator that efficiently vibrates a vibrator for transmitting flexural vibration of a piezoelectric device to a driven member even with a small piezoelectric device (piezoelectric material), a motor using the piezoelectric actuator, a robot hand and a robot including the motor.

Application Example 1

This application example of the invention is directed to a piezoelectric actuator includes at least a vibrating plate having a projection part to be urged toward a driven member at an end, and a piezoelectric material stacked on the vibrating plate, wherein a Young's modulus $E_L$ in the urging direction of the vibrating plate and a Young's modulus $E_S$ in an intersection direction crossing the urging direction are different.

According to the above described application example, a ratio of flexural vibration to longitudinal vibration of the piezoelectric actuator may be adjusted and the vibration of the piezoelectric actuator may efficiently drive the driven member.

Application Example 2

This application example of the invention is directed to the piezoelectric actuator of the above described application example, wherein the vibrating plate is formed by a plate-like base material formed by a rolling method.

According to this application example, in the plate-like base material formed by the rolling method, the young's modulus in the direction crossing the rolling direction is easily made higher than the young's modulus in the rolling direction, and thus, the difference between the young's moduli $E_L$, $E_S$ may easily be adjusted by adjustment of the direction in which the vibrating plate is cut out from the plate-like base material. Further, by forming the plate-like base material using the rolling method, a large quantity of base materials with a uniform plate thickness may be manufactured, and low-price base materials may easily be available.

Application Example 3

This application example of the invention is directed to the piezoelectric actuator of the above described application example, wherein the Young's moduli $E_L$ and $E_S$ satisfy $E_L > E_S$.

According to this application example, the ratio of flexural vibration to longitudinal vibration of the piezoelectric actuator may be improved and the vibration of the piezoelectric actuator may efficiently drive the driven member. Further, lower-power driving can be performed and the load on the drive circuit may be reduced. That is, downsizing and power saving of a system of a robot or the like may be realized by downsizing of the drive circuit.

Application Example 4

This application example of the invention is directed to the piezoelectric actuator of the above described application example, wherein the piezoelectric material is PZT (lead zirconate titanate: $Pb(Zr,Ti)O_3$).

According to this application example, vibration with a large amplitude may be obtained and a large amount of drive power may be obtained. Further, the material is easily available and inexpensive actuators may be obtained.

Application Example 5

This application example of the invention is directed to a motor including the above described piezoelectric actuator, a driven member driven by the piezoelectric actuator, and an urging unit that urges the piezoelectric actuator toward the driven member.

According to this application example, a compact high-efficiency motor may be obtained.

Application Example 6

This application example of the invention is directed to a robot hand including the motor of the above described application example.

The robot hand of this application example has a high degree of freedom and may be smaller and lighter even with many motors.

Application Example 7

This application example of the invention is directed to a robot including the above described robot hand.

The robot of this application example has high versatility and can perform assembly work, inspections, and the like of complex electronic devices.

BRIEF DESCRIPTION OF THE DRAWINGS

The invention will be described with reference to the accompanying drawings, wherein like numbers reference like elements.

FIG. 1A is an exploded perspective view and FIG. 1B is an assembly perspective view.

FIG. 4A shows an assembly plan view and FIG. 4B is a sectional view of A-A' part shown in FIG. 4A.

FIG. 7A is a schematic plan view and FIG. 7B is a schematic sectional view.

DESCRIPTION OF EXEMPLARY EMBODIMENTS

As below, an embodiment according to the invention will be explained with reference to the drawings.

First Embodiment

Figure 1A:
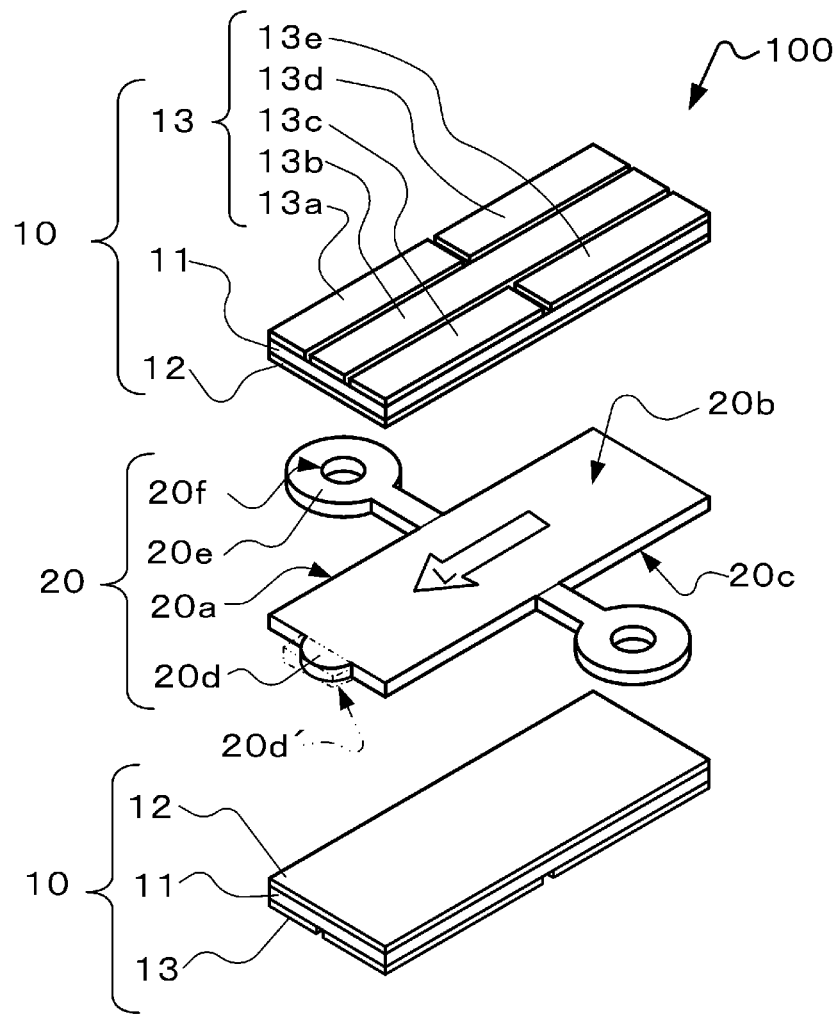
FIGS. 1A and 1B show a piezoelectric actuator according to the first embodiment.
Figure 1B:
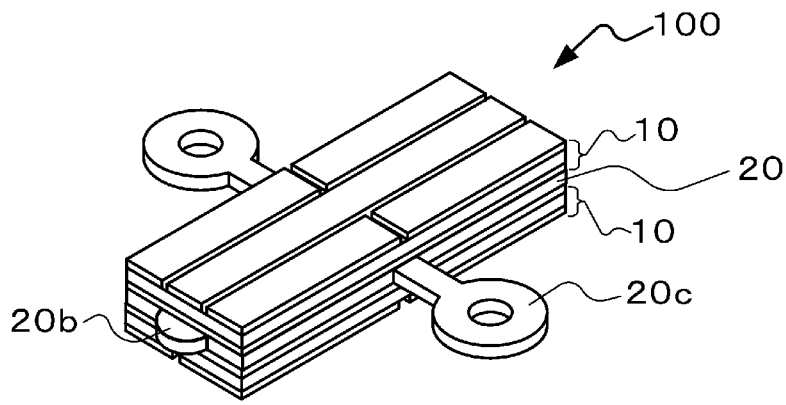

FIGS. 1A and 1B show a piezoelectric actuator according to the embodiment, and FIG. 1A is an exploded perspective view and FIG. 1B is an assembly perspective view. As shown in FIG. 1B, in a piezoelectric actuator 100 (hereinafter, referred to as "actuator 100"), piezoelectric devices 10 are stacked by fixing means such as an adhesive or a brazing filler metal alloy on one surface 20b of a plate-like vibrating plate 20 and a rear surface 20c thereof.

As shown in FIG. 1A, in the piezoelectric device 10, an electrode 12 is formed on the side bonded to the vibrating plate 20 of a rectangular piezoelectric material 11, and an electrode 13 divided into electrodes 13a, 13b, 13c, 13d, 13e is formed on the other side. As the piezoelectric material 11, a material having a piezoelectric property such as lead zirconate titanate <PZT: Pb(Zr,Ti)O$_3$>, quartz, or lithium niobate (LiNbO$_3$), for example, may be cited and, specifically, PZT is preferably used. Further, the electrodes 12, 13 may be formed by depositing a conducting metal such as Au, Ti, or Ag by evaporation, sputtering, or the like. Note that, in the case where the material of the vibrating plate 20, which will be described later, has conductivity, formation of the electrode 12 is unnecessary and the vibrating plate 20 may be used as the electrode.

The vibrating plate 20 is formed from stainless steel, nickel alloy, rubber metal, or the like, and stainless steel is used because of its easiness of processing, and a SUS 301H material is preferably used for the actuator 100 according to the embodiment. The vibrating plate 20 includes a base part 20a having a nearly rectangular shape, and a projection part 20d projected from one end in the longitudinal direction (shown as L-direction) of the base part 20a as a direction urged toward the driven member when a motor, which will be described later, is formed. The projection part 20d has an end part formed in an arc shape and is urged and brought into contact with the driven member, which will be described later. Note that, it may be a projection part 20d' with its end linearly formed. Further, in order to attach the vibrating plate 20 to a support including the urging means using a fixing member such as a screw when the motor to be described later is formed, an attachment part 20e having an attachment hole 20f is provided.

Figure 2A:
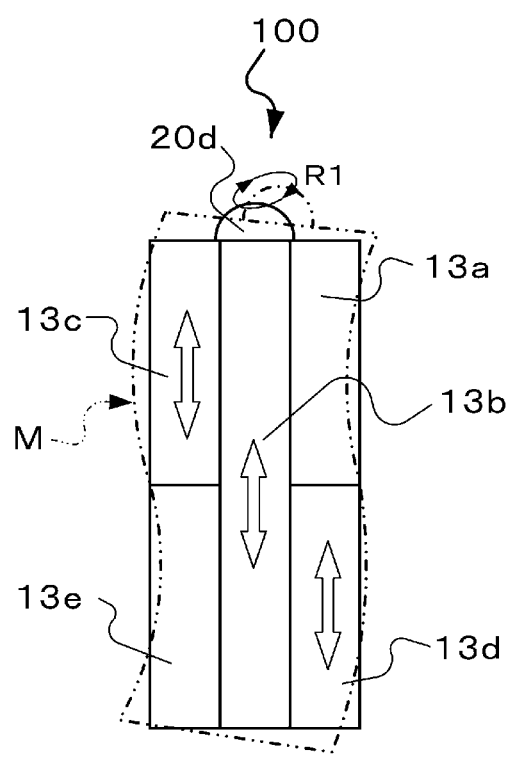
FIGS. 2A and 2B are schematic plan views showing vibration behavior of the piezoelectric actuator.
Figure 2B:
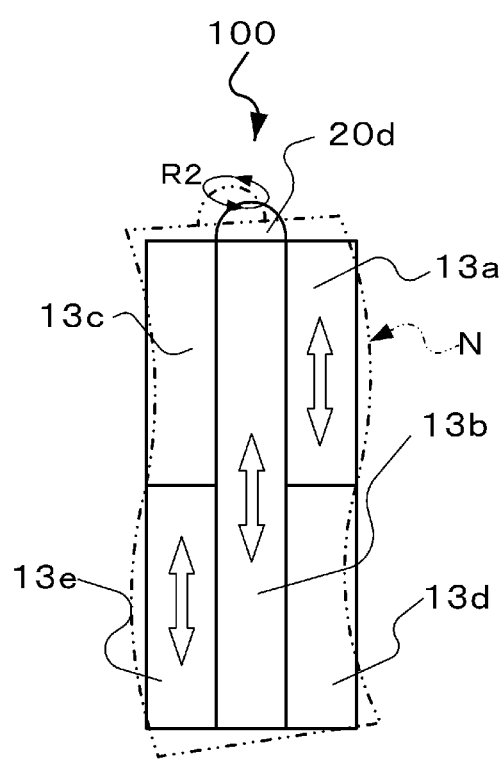

Thus formed actuator 100 operates in the following manner. FIGS. 2A and 2B are schematic plan views showing vibration behavior of the actuator 100. As shown in FIG. 2A, by applying alternating-current voltages between the electrodes 13c, 13b, 13d of the electrode 13 formed on the piezoelectric device 10 and the electrode 12 (not shown), longitudinal vibration as shown by arrows is excited in the region of the piezoelectric material 11 in which the electrodes 13c, 13b, 13d are formed. In the region of the electrode 13b, longitudinal vibration in the longitudinal direction (the L-direction shown in FIG. 1A) is excited in the actuator 100, in the regions of the electrodes 13c, 13d, flexural vibration as shown by shape M is excited in the actuator 100, and the end of the projection part 20d of the vibrating plate 20 vibrates in an elliptical orbit R1.

Further, as shown in FIG. 2B, by applying alternating-current voltages between the electrodes 13a, 13b, 13e of the electrode 13 formed on the piezoelectric device 10 and the electrode 12 (not shown), longitudinal vibration as shown by arrows is excited in the region of the piezoelectric material 11 in which the electrodes 13a, 13b, 13e are formed. In the region of the electrode 13b, longitudinal vibration in the longitudinal direction (the L-direction shown in FIG. 1A) is excited in the actuator 100, in the regions of the electrodes 13a, 13e, flexural vibration as shown by shape N is excited in the actuator 100, and the end of the projection part 20d of the vibrating plate 20 vibrates in an elliptical orbit R2.

As described above, in the actuator 100, the vibrating plate 20 converts the vibration of the piezoelectric device 10 into the vibration in the elliptical orbits R1, R2 in the projection part 20d, and means for improving the conversion efficiency is desired. Accordingly, in order to excite the vibration behavior of the vibrating plate 20 more efficiently, the vibrating plate 20 is formed in the following manner.

Figure 3A:
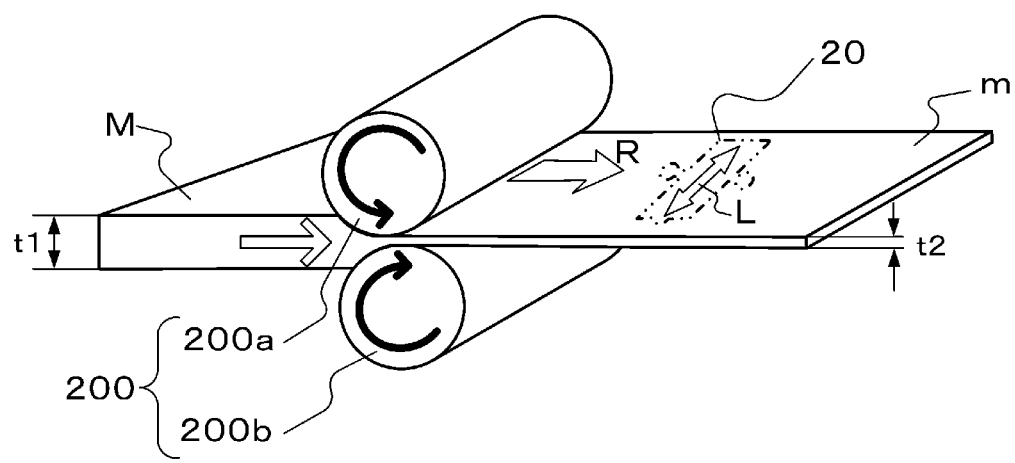
FIG. 3A is a conceptual diagram showing a forming method of a stainless-steel plate as a raw base material of a vibrating plate according to the embodiment.

FIG. 3A is a conceptual diagram showing a forming method of a stainless-steel plate as a raw base material of the vibrating plate 20 according to the embodiment. As shown in FIG. 3A, the base material forming the vibrating plate 20 is obtained by the so-called rolling method of obtaining a plate-like base material m having a thickness of t2 forming the vibrating plate 20 by passing and rolling a material M having a thickness of t1 from the left direction through a gap between a roller 200a and a roller 200b of a reduction roller 200 in the drawing. The formation (not shown) of the vibrating plate 20 is performed using a known method such as press-cutting, laser cutting, or etching of the obtained base material m, and thereby, the vibrating plate 20 may be obtained. In this regard, the longitudinal direction L of the vibrating plate 20 is placed across the reduction roll direction R of the base material m for formation.

Figure 3B:
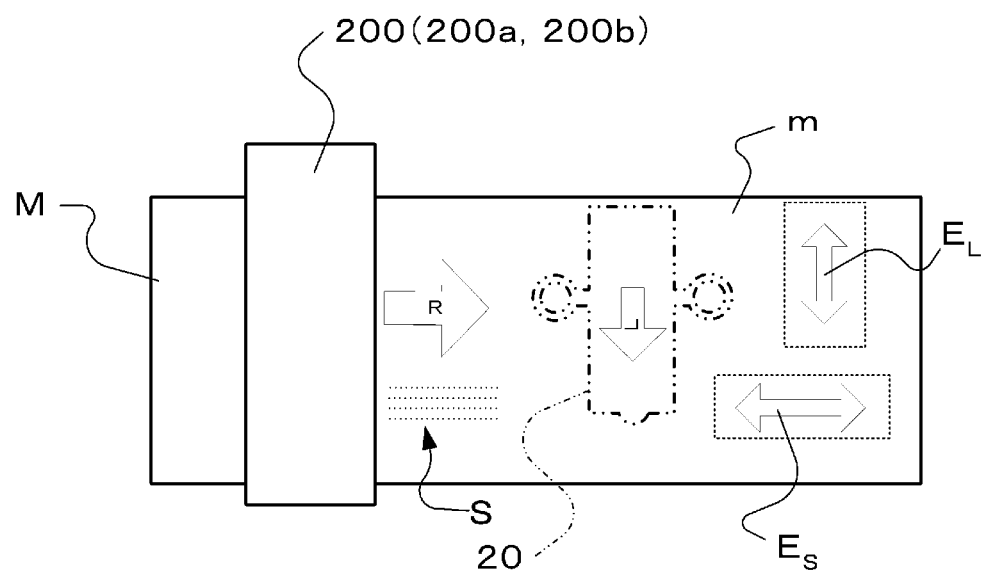
FIG. 3B is a schematic diagram showing arrangement of the vibrating plate with respect to the base material.

In the above described formation of the vibrating plate 20, the longitudinal direction L of the vibrating plate 20 is placed across the reduction roll direction R of the base material m as shown in FIG. 3B. In the reduction rolled base material m, the Young's modulus (longitudinal elastic modulus) $E_S$ of the base material m in the reduction roll direction R and the Young's modulus $E_L$ of the base material m in a direction crossing and orthogonal to the reduction roll direction R, i.e., in the longitudinal direction L of the vibrating plate 20 satisfy the relation: $E_L > E_S$, because of rolling processing distortion. That is, by placing the lateral direction as the direction crossing the direction in which the vibrating plate 20 is urged toward the driven member according to the reduction roll direction R so that the Young's modulus may be the lower Young's modulus $E_S$ in the reduction roll direction R in the vibration direction of the flexural vibration of the vibrating plate 20 that has been explained with reference to FIGS. 2A and 2B, the vibration of the piezoelectric device 10 may be transmitted to the driven member more efficiently.

Regarding the reduction roll direction R, streaky roll trails S are left along the reduction roll direction R as shown in FIG. 3B. The formation direction of the vibrating plate 20 may be identified because the roll trails S are left on the surface of the vibrating plate 20. That is, the Young's modulus in the direction of the roll trails S is $E_S$ and the Young's modulus in the direction crossing the roll trails S is $E_L$.

As described above, by placing the longitudinal direction L of the vibrating plate 20 across the reduction roll direction R of the base material m, the vibration of the piezoelectric material may efficiently be converted into the drive vibration of the projection part of the vibrating plate, and the actuator may be used as an actuator for a motor that can generate great driving power or great output even in the small size.

Second Embodiment

Figure 4A:
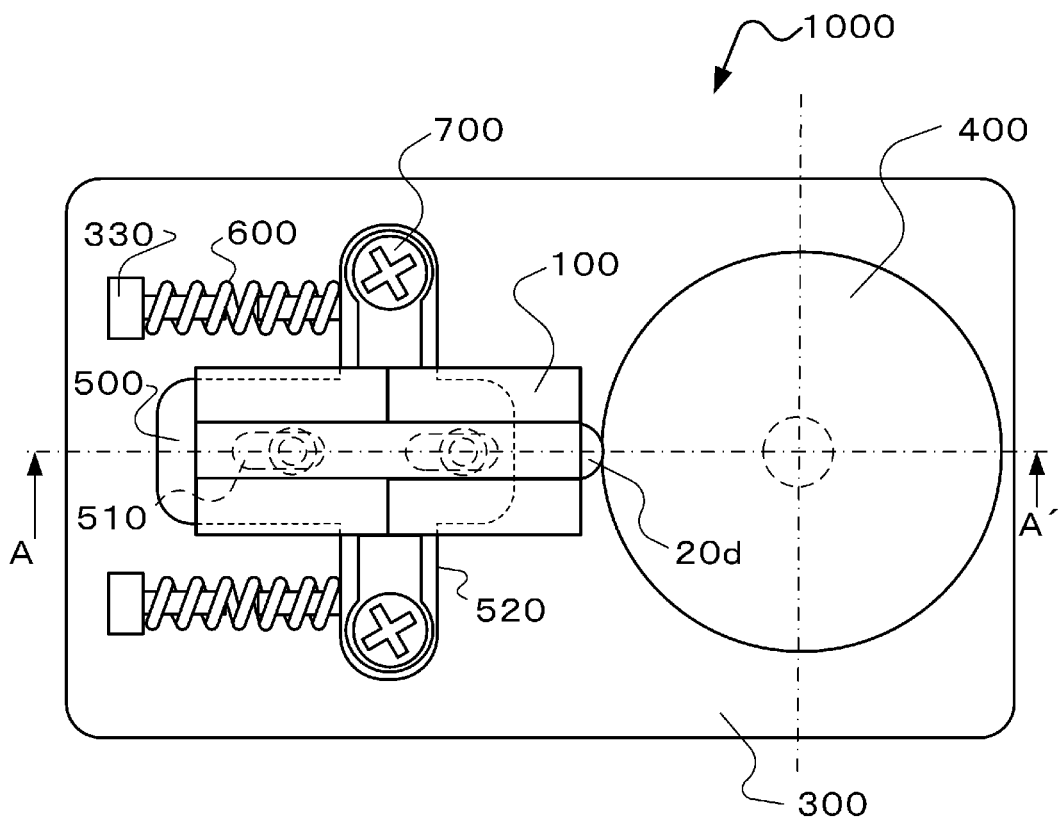
FIGS. 4A and 4B show a motor according to the second embodiment.
Figure 4B:
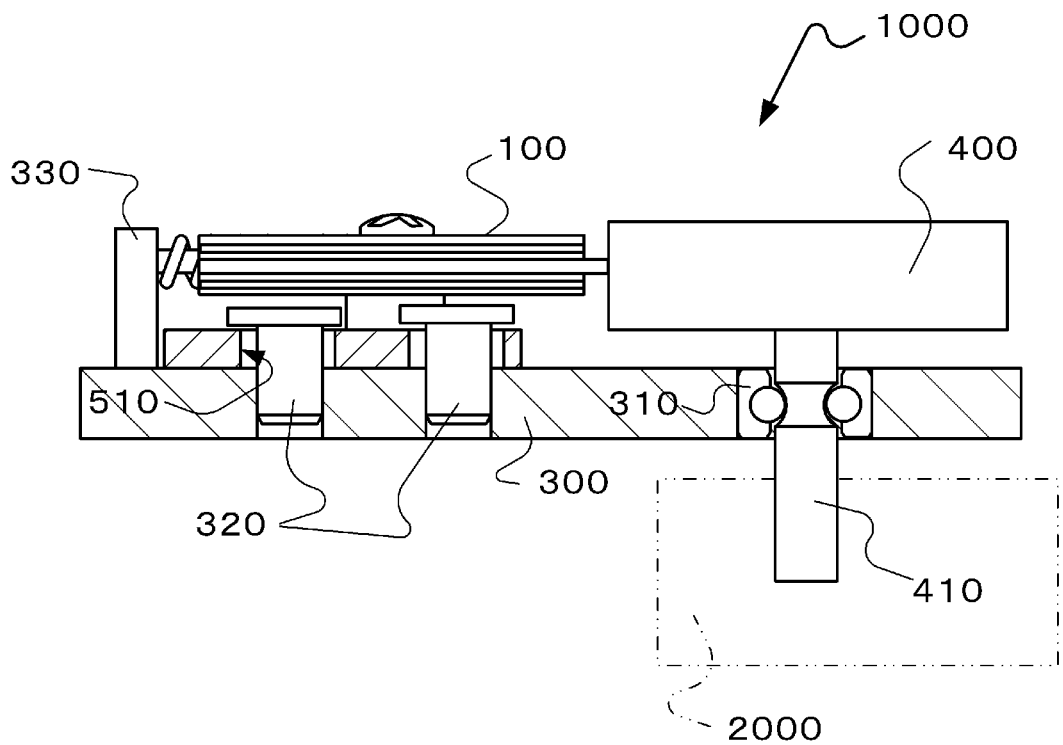

A motor including the actuator 100 according to the first embodiment will be explained as the second embodiment. FIGS. 4A and 4B show a motor 1000 according to the second embodiment, and FIG. 4A shows an assembly plan view and FIG. 4B is a sectional view of A-A' part shown in FIG. 4A. As shown in FIG. 4A, the motor 1000 includes a base 300, a driven member 400 rotatably fixed to the base 300, a support 500 slidably fixed to the base 300, a coil spring 600 as urging means for urging the support 500 toward the driven member 400, and the actuator 100 fixed to the support 500 by screws 700 as fixing members.

The driven member 400 is fixed to the base 300 by rotating means including a rotational shaft 410, a bearing 310, etc. as shown in FIG. 4B. The rotary force of the rotational shaft drives a driven unit with a desired rotation speed or output toque via an acceleration or deceleration unit 2000 (not shown) connected to the rotational shaft.

The support 500 includes guide holes 510, guide pins 320 of the base 300 are inserted into the guide holes 510, and thereby, the support 500 is slidably fixed to the base 300. The shape of the guide hole 510 is a track-like flat shape in the embodiment so that the support 500 may be slidable in the urging direction of the actuator 100, and is slightly larger than the outer diameter of the guide part of the guide pin 320 in the direction crossing the urging direction of the actuator 100 so that the amount of rattling in the direction crossing the urging direction of the actuator 100 may be the minimum.

Further, in the support 500, one end of the coil spring 600 as urging means is attached to a fixing arm 520 on which the actuator 100 is mounted. The other end of the coil spring 600 is attached to a spring attachment part 330 of the base 300, and the support 500 is urged toward the driven member 400. Note that, as the urging means, not limited to the coil spring 600, but, for example, a leaf spring, an elastic rubber, or the like may be used.

Furthermore, the attachment part 20e of the vibrating plate 20 of the actuator 100 is mounted on the fixing arm 520 of the support 500, and the actuator 100 is fixed to the support 500 by the screws 700 into screw holes (not shown) provided in the fixing arm 520. The projection part 20d of the fixed actuator 100 is urged toward the driven member 400 with a predetermined force via the support 500.

In the motor 1000 having the configuration, the vibration behavior of the projection part 20d of the actuator 100 that has been explained with reference to FIGS. 2A and 2B provides rotation drive to the driven member 400 by the urging force of the actuator 100 toward the driven member 400.

As described above, by using the piezoelectric actuator that may efficiently convert the vibration of the piezoelectric material into the drive vibration of the projection part of the vibrating plate, a motor that can generate great driving power or great output even in the small size may be obtained.

Third Embodiment

Figure 5:
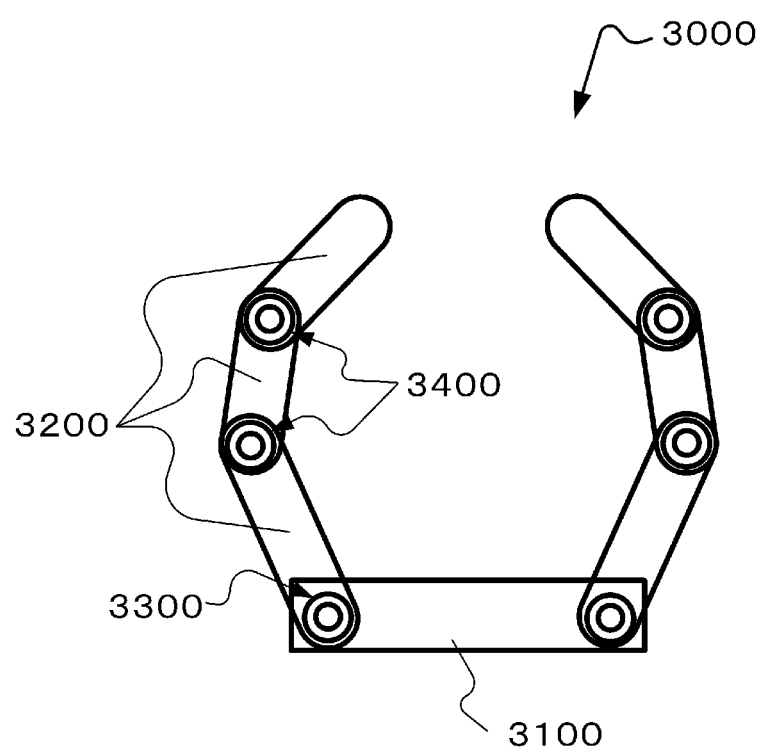
FIG. 5 is an appearance view showing a robot hand according to the third embodiment.

FIG. 5 is an appearance view showing a robot hand 3000 of the motor 1000 according to the second embodiment. The robot hand 3000 includes a base part 3100 and finger parts 3200 connected to the base part 3100. The motors 1000 are incorporated into a connection part 3300 between the base part 3100 and the finger parts 3200 and joint parts 3400 of the finger parts 3200. When the motors 1000 are driven, the finger parts 3200 bend to grasp an object. By using the motors 1000 as ultracompact motors, a robot hand including many motors even in the small size may be realized.

Fourth Embodiment

Figure 6:
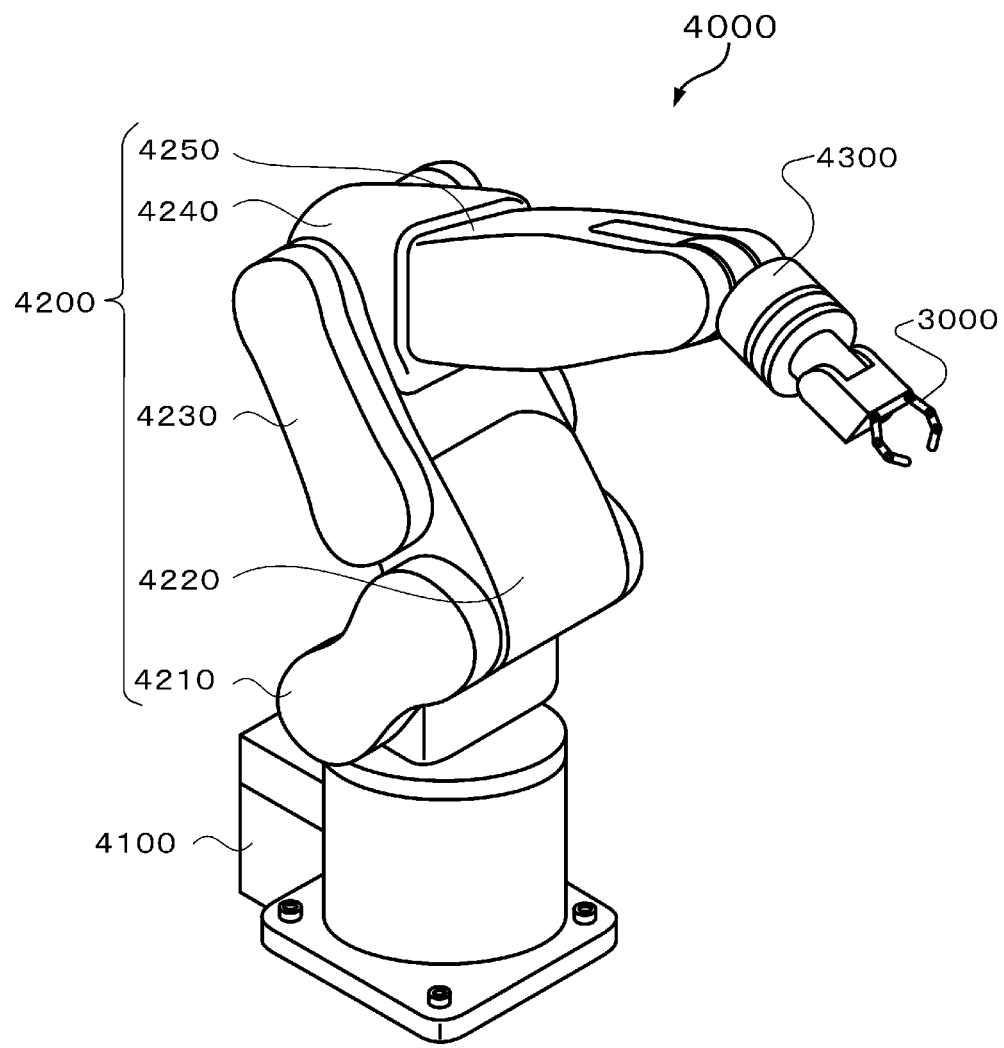
FIG. 6 is an appearance view showing a robot according to the fourth embodiment.

FIG. 6 shows a robot 4000 including the robot hand 3000. The robot 4000 includes a main body part 4100, an arm part 4200, the robot hand 3000, etc. The main body part 4100 is fixed onto a floor, a wall, a ceiling, a movable carriage, or the like, for example. The arm part 4200 is movably provided with respect to the main body part 4100, and the main body part 4100 contains an actuator that generates power for rotating the arm part 4200, a control unit that controls the actuator, etc. (not shown).

The arm part 4200 includes a first frame 4210, a second frame 4220, a third frame 4230, a fourth frame 4240, and a fifth frame 4250. The first frame 4210 is rotatably or bendably connected to the main body part 4100 via a rotating and bending shaft. The second frame 4220 is connected to the first frame 4210 and the third frame 4230 via a rotating and bending shaft. The third frame 4230 is connected to the second frame 4220 and the fourth frame 4240 via a rotating and bending shaft. The fourth frame 4240 is connected to the third frame 4230 and the fifth frame 4250 via a rotating and bending shaft. The fifth frame 4250 is connected to the fourth frame 4240 via the rotating and bending shaft. In the arm part 4200, the respective frames 4210 to 4250 compositely move by rotating and bending around the respective rotating and bending shafts according to the control of the control unit.

A robot hand connection part 4300 is connected to the other side provided with the fourth frame 4240 of the fifth frame 4250 of the arm part 4200, and the robot hand 3000 is attached to the robot hand connection part 4300. The robot hand connection part 4300 contains a motor that provides rotational operation to the robot hand 3000, and thereby, the robot hand 3000 may grasp an object. By using the compact and lightweight robot hand 3000, a versatile robot that can perform assembly work, inspections, and the like of complex electronic devices may be provided.

Working Example

Figure 7A:
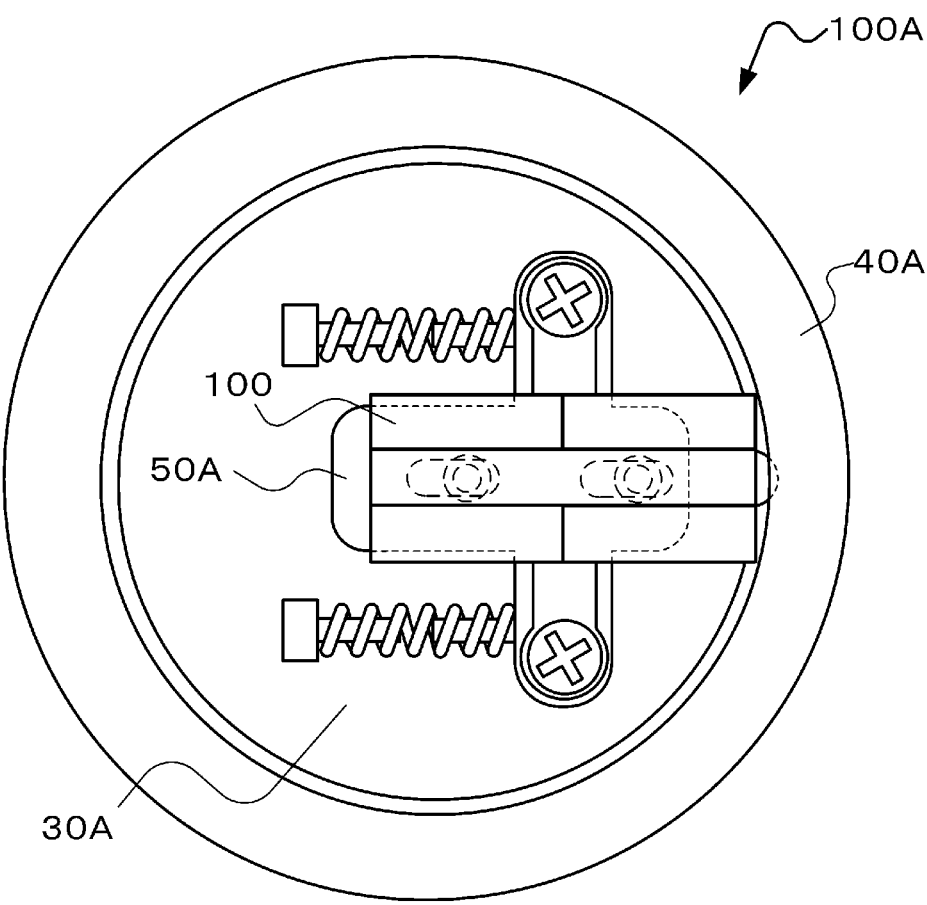
FIGS. 7A and 7B show a drive unit according to a working example.
Figure 7B:
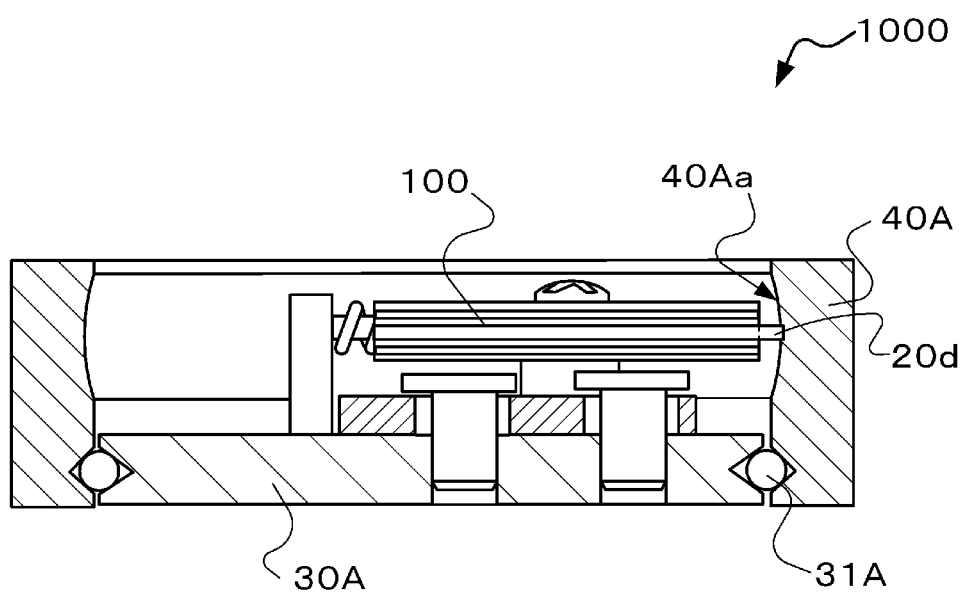

The characteristics of the actuator 100 was evaluated using a drive unit 100A shown in FIGS. 7A and 7B. FIG. 7A is a schematic plan view of the drive unit 100A and FIG. 7B is a schematic sectional view of the drive unit 100A. As shown in FIG. 7A, in the drive unit 100A, the actuator 100 using PZT as a piezoelectric material is fixed to a support 50A fixed to a base 30A and, as shown in FIG. 7B, a ring-shaped driven member 40A having an inner circumferential surface 40Aa in contact with the projection part 20d is provided. The inner circumferential surface 40Aa of the driven member 40A is formed in a convex shape in the diameter direction. Further, the driven member 40A and the base 30A are rotatably fixed by ball bearings 31A or the like.

Figure 8:
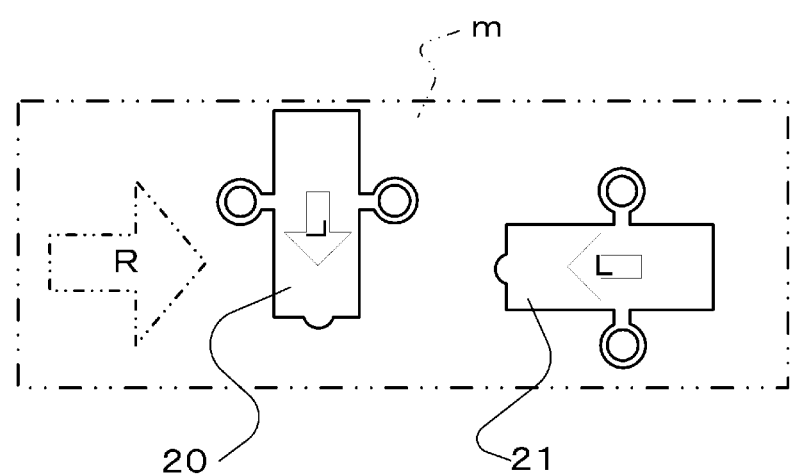
FIG. 8 is a diagram for explanation of formation of vibrating plates according to the working example.

Furthermore, regarding the actuator 100, as shown in FIG. 8, in an actuator sample A (hereinafter, referred to as "sample A") the vibrating plate 20 punching-formed by press working in the longitudinal direction L crossed with respect to the reduction roll direction R of the base material m using a raw material of SUS 301EH having a thickness of 0.5 mm was used and in an actuator sample B (hereinafter, referred to as "sample B") used a vibrating plate 21 formed with the longitudinal direction L according to the reduction roll direction R was used.

From measurement of Young's moduli in the longitudinal direction L of the vibrating plate 20 of the sample A and the vibrating plate 21 of the sample B obtained in this manner, 220 GPa for the sample A (vibrating plate 20) and 190 GPa for the sample B (vibrating plate 21) were found and, the higher Young's modulus was obtained from the sample A (vibrating plate 20) obtained with the longitudinal direction L crossed with the reduction roll direction R.

Impedance Characteristics

Figures 9A, 9B:
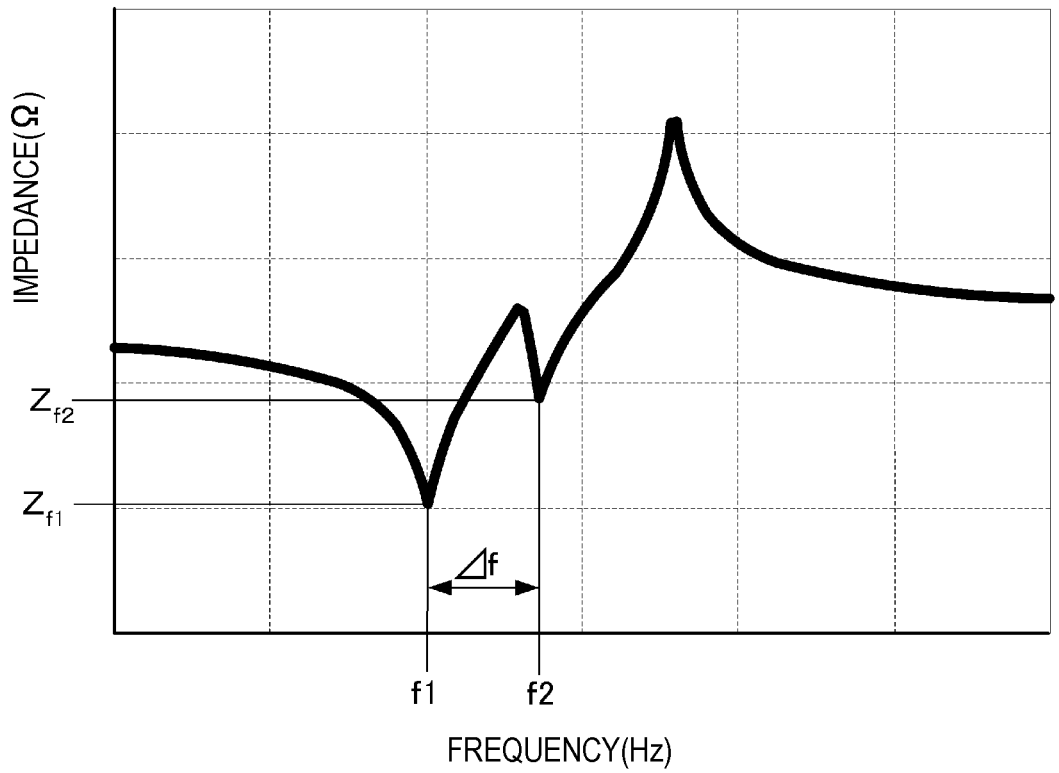
FIGS. 9A and 9B show results of impedance characteristics of a piezoelectric actuator according to the working example.

In order to obtain an impedance curve shown in FIG. 9A, the samples A, B were measured and results in FIG. 9B were obtained. From the results in FIG. 9B, the flexural resonance impedance $Z_{f2}$ took a smaller value in the sample A than that in the sample B. Since the impedance is inversely proportional to the vibration trajectory of the projection part 20d of the actuator 100, the amount of displacement in flexural vibration is made larger in the sample A than that in the sample B in flexural resonance.

Drive Characteristics

Figure 10:
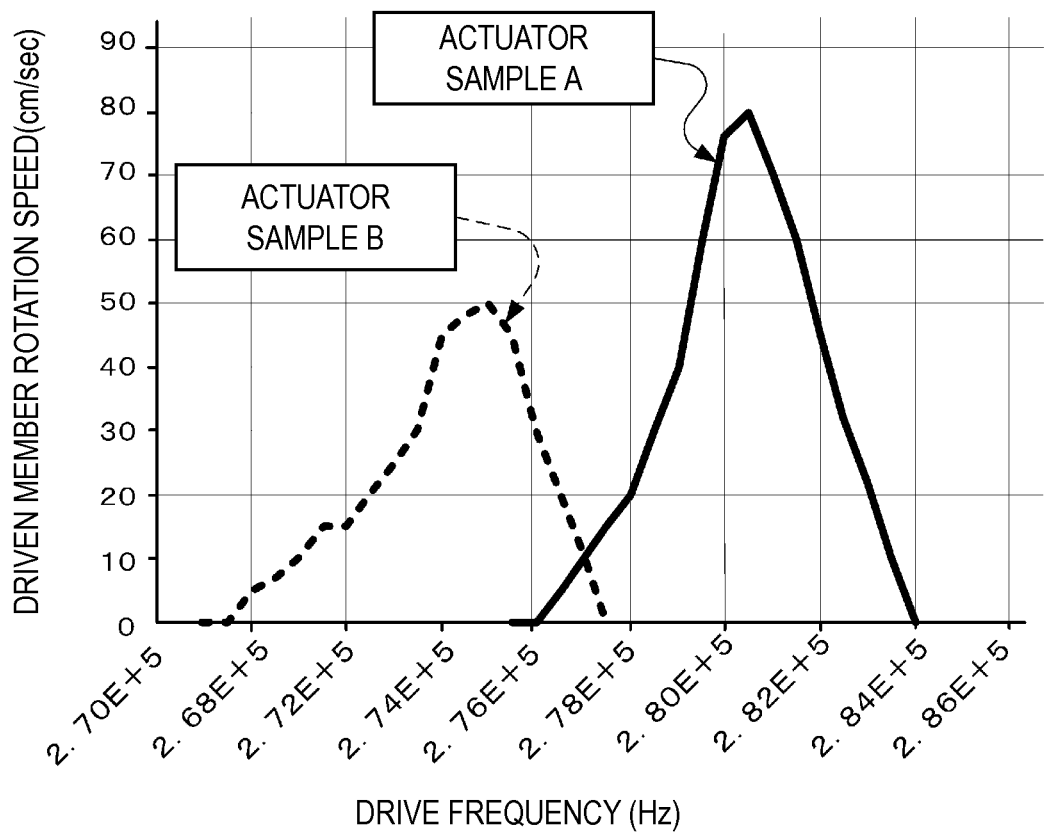
FIG. 10 shows results of drive characteristics of the drive unit according to the working example.

Next, drive characteristics of the sample A and the sample B were confirmed in the drive unit 100A shown in FIGS. 7A and 7B. A sine-wave current of ±5 V was input to the drive unit 100A as a drive voltage, a relationship between the rotation speed of the driven member 40A and the frequency of elliptic oscillation in the projection part 20d was measured, and results in FIG. 10 were obtained. As shown in FIG. 10, the higher rotation speed may be obtained in the sample A than that in the sample B with respect to the input power (sine-wave current of ±5 V as the drive voltage).

As described above, by forming the vibrating plate 20 with the longitudinal direction L crossed with the reduction roll direction R of the base material m (see FIGS. 3A and 3B), that is, by making the Young's modulus in the longitudinal direction L of the vibrating plate 20 larger, a piezoelectric actuator with high drive efficiency may be obtained.

The entire disclosure of Japanese Patent Application No. 2011-073559, filed Mar. 29, 2011 is expressly incorporated by reference herein.

What is claimed is:

1. A piezoelectric actuator at least comprising:
   a vibrating plate having a projection part to be urged toward a driven member at an end; and
   a piezoelectric material stacked on the vibrating plate,
   wherein a Young's modulus $E_L$ in the urging direction of the vibrating plate and a Young's modulus $E_S$ in an intersection direction crossing the urging direction are different.

2. The piezoelectric actuator according to claim 1, wherein the vibrating plate is formed by a plate-like base material formed by a rolling method.

3. The piezoelectric actuator according to claim 1, wherein values of the Young's modulus $E_L$ and the Young's modulus $E_S$ satisfy the following relationship:

$$E_L > E_S.$$

4. The piezoelectric actuator according to claim 1, wherein the piezoelectric material is lead zirconate titanate (PZT).

5. A motor comprising:
   the piezoelectric actuator according to claim 1;
   a driven member driven by the piezoelectric actuator; and
   an urging unit that urges the piezoelectric actuator toward the driven member.

6. A motor comprising:
   the piezoelectric actuator according to claim 2;
   a driven member driven by the piezoelectric actuator; and
   an urging unit that urges the piezoelectric actuator toward the driven member.

7. A motor comprising:
   the piezoelectric actuator according to claim 3;
   a driven member driven by the piezoelectric actuator; and
   an urging unit that urges the piezoelectric actuator toward the driven member.

8. A motor comprising:
   the piezoelectric actuator according to claim 4;
   a driven member driven by the piezoelectric actuator; and
   an urging unit that urges the piezoelectric actuator toward the driven member.

9. A robot hand comprising the motor according to claim 5.

10. A robot hand comprising the motor according to claim 6.

11. A robot hand comprising the motor according to claim 7.

12. A robot hand comprising the motor according to claim 8.

13. A robot comprising the robot hand according to claim 9.

14. A robot comprising the robot hand according to claim 10.

15. A robot comprising the robot hand according to claim 11.

16. A robot comprising the robot hand according to claim 12.

17. A motor comprising:
   a vibrating plate having a projection part;
   a piezoelectric material provided on the vibrating plate;
   a driven part driven by vibration of the projection part in contact with the projection part; and
   an urging unit that urges the vibrating plate toward the driven part,
   wherein a Young's modulus $E_L$ of the vibrating plate in the urging direction and Young's modulus $E_S$ of the vibrating plate in a direction crossing the urging direction are different.

18. A robot comprising:
   a vibrating plate having a projection part;
   a piezoelectric material provided on the vibrating plate;
   a driven part driven by vibration of the projection part in contact with the projection part;
   an urging unit that urges the vibrating plate toward the driven part; and
   plural finger parts that grasp an object,
   wherein a value of a Young's modulus $E_L$ of the vibrating plate in the urging direction and a value of a Young's modulus $E_S$ of the vibrating plate in a direction crossing the urging direction are different in magnitude.

19. The robot according to claim 18, wherein the value of the Young's modulus $E_L$ is larger than the value of the Young's modulus $E_S$.

* * * * *